(12) United States Patent
Chen

(10) Patent No.: US 6,942,500 B2
(45) Date of Patent: Sep. 13, 2005

(54) SURFACE MOUNTABLE CLIP SUITABLE FOR USE IN A MOBILE COMMUNICATION DEVICE

(75) Inventor: Chao Chen, Waterloo (CA)

(73) Assignee: Research in Motion Limited, Waterloo (CA)

( * ) Notice: Subject to any disclaimer, the term of this patent is extended or adjusted under 35 U.S.C. 154(b) by 0 days.

(21) Appl. No.: 10/721,696

(22) Filed: Nov. 25, 2003

(65) Prior Publication Data
US 2004/0140414 A1 Jul. 22, 2004

Related U.S. Application Data

(60) Provisional application No. 60/429,535, filed on Nov. 29, 2002.

(51) Int. Cl.[7] ............................................. H01R 12/00
(52) U.S. Cl. ........................... 439/83; 248/510; 455/90
(58) Field of Search .......................... 439/83; 248/510; 455/90

(56) References Cited

U.S. PATENT DOCUMENTS

| 2,909,354 | A | | 10/1959 | Bingham | |
|---|---|---|---|---|---|
| 5,539,417 | A | | 7/1996 | Terry et al. | |
| 5,974,304 | A | * | 10/1999 | Chen | 455/90.2 |
| 5,986,608 | A | * | 11/1999 | Korisch et al. | 343/702 |
| 6,051,781 | A | | 4/2000 | Bianca et al. | |
| 6,134,421 | A | * | 10/2000 | Lee et al. | 455/575.9 |
| 6,317,085 | B1 | * | 11/2001 | Sandhu et al. | 343/702 |

FOREIGN PATENT DOCUMENTS

| GB | 911455 | 11/1962 |
|---|---|---|

OTHER PUBLICATIONS

"Search Report for Application # PCT/CA 03/01853", Nov. 28, 2003.

* cited by examiner

*Primary Examiner*—Truc Nguyen
(74) *Attorney, Agent, or Firm*—John J. Oskorep, Esq.

(57) ABSTRACT

A mobile communication device includes a printed circuit board (PCB); a radio frequency (RF) transceiver carried on the PCB; and an antenna coupled to the RF transceiver. A surface mountable antenna clip is mounted on the PCB for retaining the antenna. The clip is a metal structure having a plurality of planar sides generally formed into a U-shape. An opening formed by the structure is sized to receive and retain the antenna. One of the planar sides is used to support the structure and is mounted over a solder pad of the PCB. A hole formed through this planar side is configured to break a surface tension of molten solder over a solder pad of the PCB during a reflow soldering process, so that the clip is more stable and tends not to rotate out-of-position during the process. Legs extending from edges of this planar side also help to stabilize the clip during the process, and provide an increased surface area for the connection. In fact, if the initial Surface-Mount Technology (SMT) placement position of the clip is slightly skewed or shifted, surface tension forces will help the clip to move or rotate into the correct position. The legs also provide sufficient features to a vision system to correctly orient the clip on the PCB.

10 Claims, 6 Drawing Sheets

SURFACE MOUNTABLE CLIP SUITABLE FOR USE IN A MOBILE COMMUNICATION DEVICE

CROSS-REFERENCE

This application claims the benefit of U.S. Provisional Application Ser. No. 60/429,535, filed on Nov. 29, 2002, the entire disclosure of which is incorporated herein by reference.

BACKGROUND

1. Field of the Invention

The present invention relates generally to surface mountable clips, and more particularly to surface mountable antenna clips suitable for use in mobile communication devices.

2. Description of the Related Art

Printed circuit boards (PCBs) are typically used in most electronic devices, including mobile communication devices, mobile telephones, and PDAs. Surface-Mount Technology (SMT) allows components such as resisters, capacitors, memory chips, processors and clips to be mounted to a PCB. In order to mount a component to a PCB, a solder pad is attached to the PCB. The component is then placed on top of the solder pad, and then the PCB is passed through a reflow oven. Inside the oven, the solder melts, and the solder adheres to the component. When the solder cools, the component is firmly attached to the PCB.

Placement of the component onto the PCB is aided by a vision system. A vision system includes a camera which can detect the orientation of the component before it is placed on the PCB. The orientation is compared to stored data which specifies how the component should be orientated for placement onto the PCB. The vision system can thus determine whether the component is properly oriented. If the component is not properly oriented, then the orientation can be corrected, or the component or PCB can be rejected. This prevents components from being placed onto the solder pad on the PCB in an incorrect fashion.

The component may be a surface mountable clip which is placed and soldered onto a solder pad on the PCB in this manner. Once mounted on the PCB, the clip is utilized to receive and retain an electrical component such as an antenna. The clip may have a bottom planar surface for supporting the clip and making both a physical and electrical connection with the solder pad. When the clip is placed onto the solder pad and oven heat is applied, the surface tension of the solder may cause solder build-up at the center of the solder pad to thereby cause the solder to have arcuate top surface. The clip therefore only has a small area of contact with the solder at the center of the solder pad. This undesirably provides the clip with a tendency to rotate out-of-position during the reflow oven process, which leads to undesirable positioning and alignment errors relative to the PCB. Also, a relatively weak bond will be made with the solder pad.

SUMMARY

A surface mountable clip which is suitable for use in a mobile communication device is described herein. The surface mountable clip is mounted on a printed circuit board (PCB) and retains an electrical component, such as an antenna. The surface mountable clip is made of a metal structure having a plurality of planar sides generally formed into a U-shape. An opening formed by the structure is sized to fit the electrical component. One of the planar sides is used to support the structure and is mounted over a solder pad on the PCB. A hole formed through this planar side is configured to break a surface tension of molten solder over a solder pad of the PCB during a reflow soldering process, so that the clip is more stable and tends not rotate out-of-position during such process. Legs extending from edges of this planar side also help to stabilize the clip during the process, and provide for an increase surface area for the connection. In fact, if the initial Surface-Mount Technology (SMT) placement position of the clip is slightly skewed or shifted, surface tension forces will help the clip to move or rotate into the correct position. Finally, the legs provide sufficient structural features on the clip for a vision system for correctly orienting the clip on the PCB.

BRIEF DESCRIPTION OF THE DRAWINGS

Embodiments of present invention will now be described by way of example with reference to attached figures, wherein.

DETAILED DESCRIPTION OF THE PREFERRED EMBODIMENTS

Figure 1:
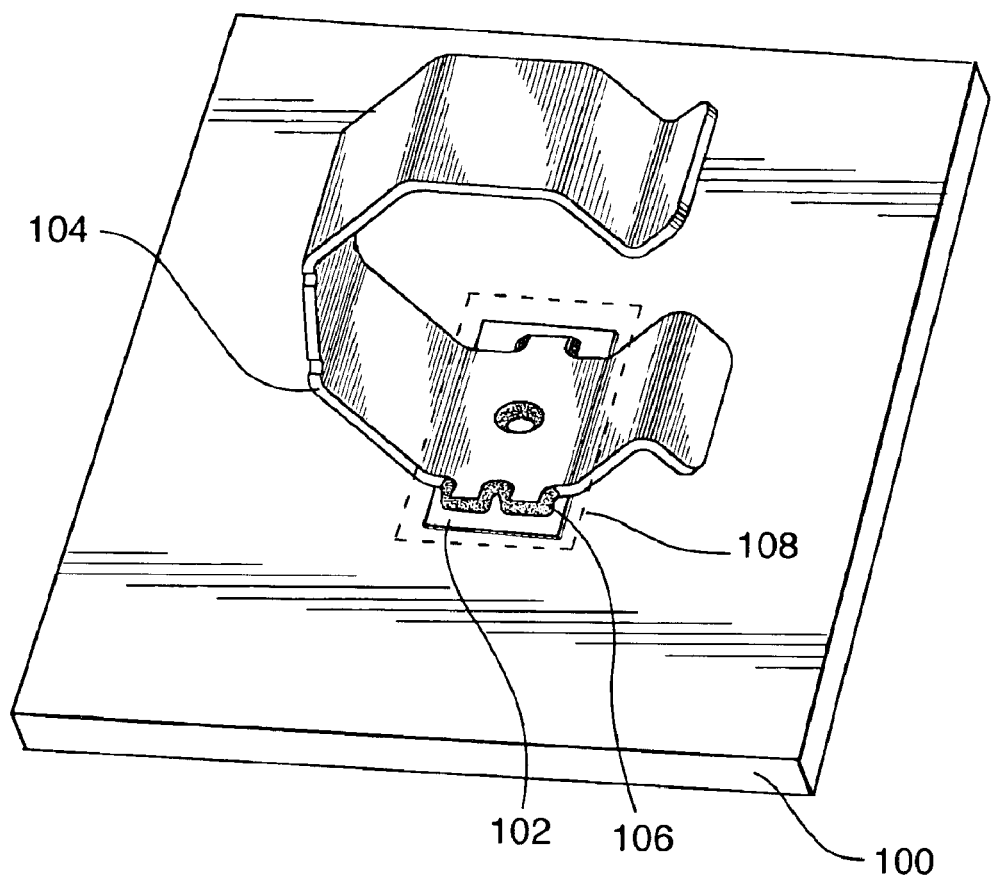
FIG. 1 is an illustration of a surface mountable clip which is mounted to a printed circuit board (PCB)

FIG. 1 is an illustration of a surface mountable clip 104 which is fixedly mounted to a substrate such as a printed circuit board (PCB) 100. More particularly, clip 104 is mounted and electrically coupled to a solder pad 102 formed on PCB 100 using solder 106. Prior to mounting using Surface-Mount Technology (SMT) techniques, clip 104 is dispensed from a tape-and-reel package onto solder pad 102. As will be appreciated by those skilled in the art to which the present invention pertains, tape-and-reel packaging facilitates the process of attaching clips and other components to PCBs. A vision system (not shown) is used to verify that clip 104 is oriented properly on solder pad 102. If the vision system determines that clip 104 is not oriented correctly, then the orientation of clip 104 is corrected before it is placed on solder pad 102, or clip 104 is not placed on solder pad 102. After clip 104 is placed on top of the solder pad 102, PCB 100 is passed through a reflow oven which melts solder 106 over solder pad 102 so that solder 106 bonds clip 104 to solder pad 102. Thus, when solder 106 cools, the clip 104 is firmly and fixedly attached to solder pad 102 and PCB 100.

Figure 2:
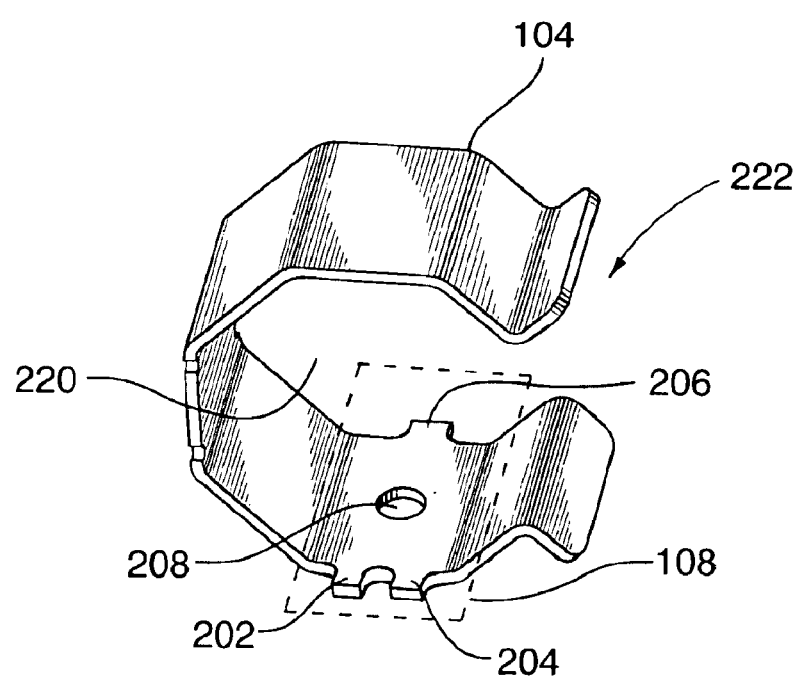
FIG. 2 is a close-up view of the clip of FIG. 1.

FIG. 2 is a close-up view of clip 104 of FIG. 1. Clip 104 is a metal structure having a plurality of planar sides which are integrally formed into a U-shape. The metal which forms clip 104 may be any suitable electrically conductive metal, such as phosphor bronze, beryllium copper (BeCu), or alloys thereof. The planar sides of clip 104 are integrally formed into a polygon shape having a single open side 222. In this embodiment, the planar sides of clip 104 are integrally formed into an "octagon" shape having a single open side 222 (i.e. octagon=8 sides with 1 open side=7 sides). However, any suitable number of planar sides may be utilized. In this embodiment, each planar side of clip 104 has dimensions of about 1.8 mm×2.5 mm×0.15 mm, and the octagon-shape has a diameter of about 4.4 mm. Open side 222 of the generally U-shaped structure provides a flexibility and resiliency in clip 104 to facilitate the receiving and retaining of an electrical component (not shown in FIG. 1 or 2). As shown, open side 222 is flanged at both ends to further facilitate the receiving of the electrical component in a "snap-fit" type fashion An opening 220 formed by the generally U-shape structure of clip 104 is sized to fit and retain the electrical component. One of the planar sides of clip 104, which may be referred to as a mounting portion 108 of clip 104, is used for supporting and mounting clip 104 over solder pad on PCB 100 (FIG. 1).

Figure 7:
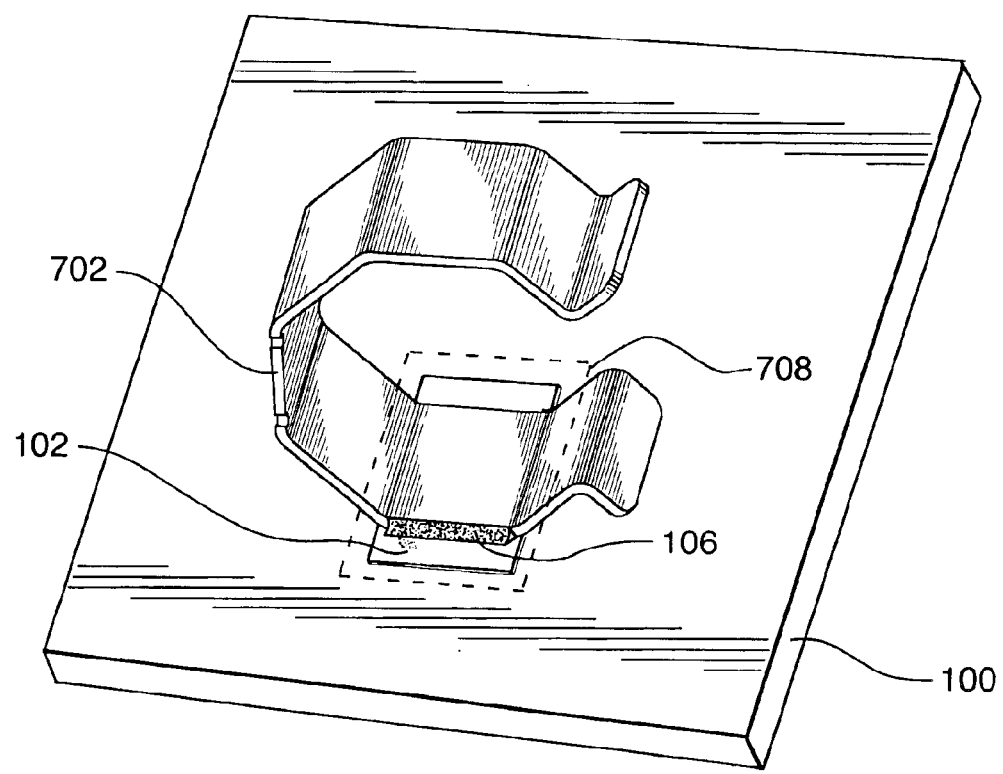
FIG. 7 is an illustration of a clip assembly without the features of the mounting portion of the clip of FIGS. 1–4.
Figure 8:
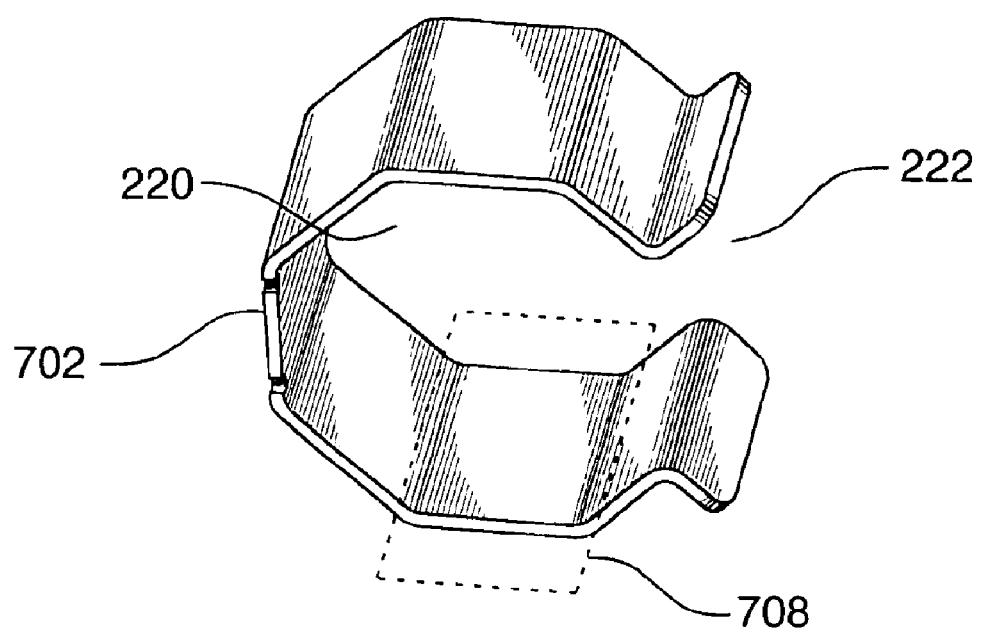
FIG. 8 is a close-up view of the clip of FIG. 7.
Figure 9:
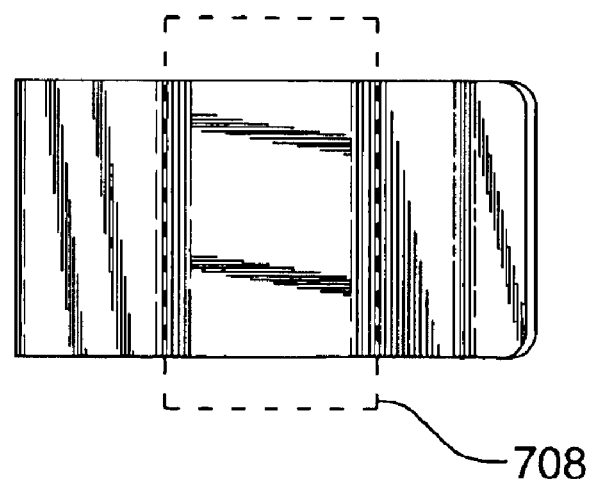
FIG. 9 is a close-up view of the mounting portion of the clip of FIG. 8.
Figure 10:
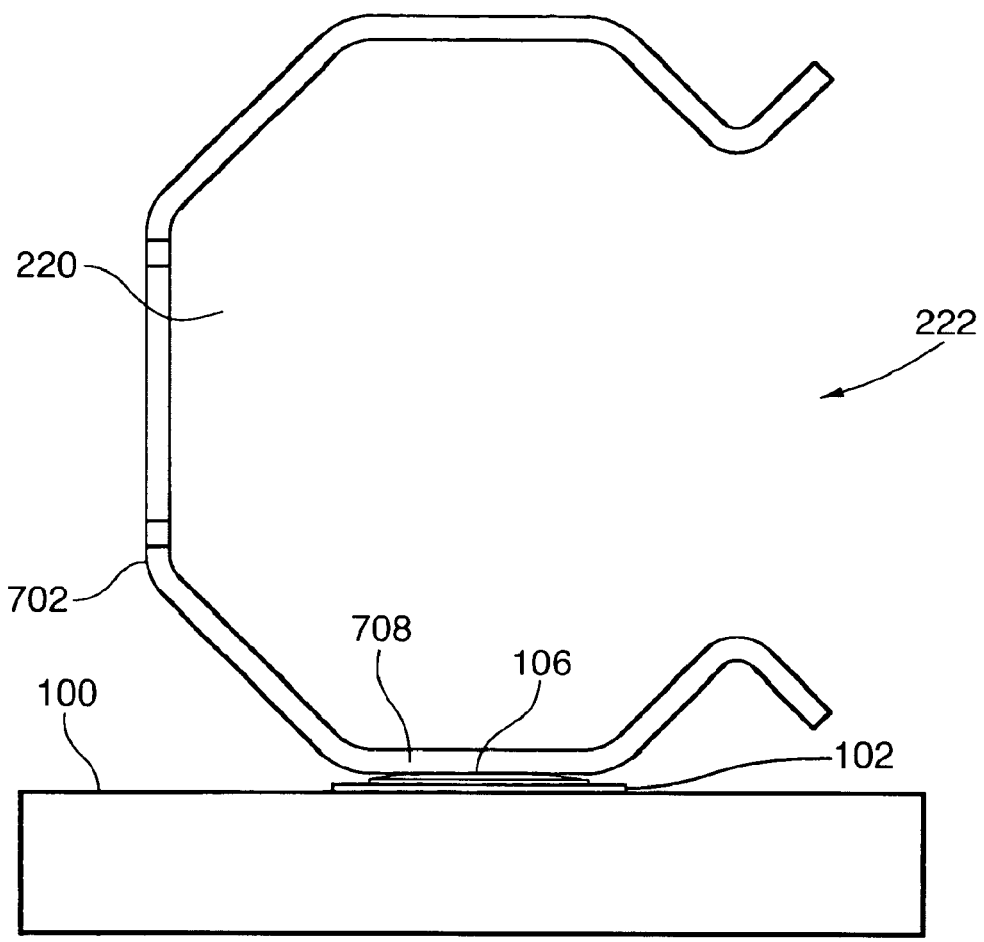
FIG. 10 is a side view of the clip of FIGS. 7–9 positioned over molten solder having a surface tension which undesirably carries the clip on top of the molten solder.

Prior to discussing mounting portion 108 of clip 104 in detail, the use of a surface mountable clip 702 of FIGS. 7–10 which does not have mounting portion 108 of clip 104 of FIGS. 1–4 will be described. FIG. 7 is an illustration of surface mountable clip 702 which includes a mounting portion 708; FIG. 8 is a close-up view of clip 702 of FIG. 7; and FIG. 9 is a close-up view of mounting portion 708. As shown, mounting portion 708 is integrally formed with clip 702 and is a generally rectangular planar structure without any distinctive features. FIG. 10 shows a side view of clip 702 of FIGS. 7–9 positioned over molten solder 106 during a reflow soldering process. When clip 702 is placed onto solder pad 102 and oven heat is applied, the surface tension of solder 106 causes solder build-up at the center of solder pad 102 to cause solder 106 to have arcuate top surface. Clip 702 therefore only has a small area of contact with solder 106 at the center of solder pad 102. This undesirably provides clip 702 with a tendency to rotate out-of-position during the reflow oven process, which leads to undesirable positioning and alignment errors relative to the PCB. Also, a relatively weak bond will be made with solder pad 102.

Referring back to FIGS. 1–3 for describing the clip 104 of the present application, mounting portion 108 comprises the bottom planar side of clip 104 and includes a hole 208 and legs 202, 204, and 206 (FIGS. 2–3). Hole 208 formed through this side is configured to break a surface tension of molten solder over a solder pad of the PCB during a reflow soldering process, so that the clip is stable and does not rotate out-of-position during the process. Preferably, hole 208 is located in a center of mounting portion 108. Legs 202, 204, and 206 extend laterally from the sides and along the same plane as mounting portion 108. In this embodiment, legs 202 and 204 are formed along one side edge of mounting portion 108, whereas leg 206 is formed along the other side edge of mounting portion 108. The diameter of hole 208 may be between about 0.5 mm and 0.7 mm, and preferably 0.6 mm; whereas the dimensions of each leg 202, 204, and 206 may be about 0.35×0.5 mm.

When clip 104 which includes mounting portion 108 is placed onto solder pad 102, legs 202, 204, 206 and hole 208 in mounting portion 108 provide multiple points of contact with solder pad 102. As a result, the tension forces acting on clip 104 are balanced such that mounting portion 108 is stable, so that clip 104 does not shift or rotate in an undesirable position as passes through the reflow oven. In fact, if the initial SMT placement position of clip 104 is slightly skewed or shifted, surface tension forces will help mounting portion 108 to be adjusted (moved or rotated) to the correct position. This is because the surface tension forces always intend to reach a balanced state. In addition, hole 208 in mounting portion 108 allows mounting portion 108 to sink into solder 106 as the clip assembly moves through the reflow oven. This prevents clip 104 from floating and changing position as solder 106 on solder pad 102 melts. Legs 202, 204, 206 and hole 208 in mounting portion 108 also provide increased surface area along the edges of mounting portion 108 which are in contact with solder pad 102. As a result, mounting portion 108 is firmly attached to PCB 100 after it has passed through the reflow oven and cooled.

Figure 3:
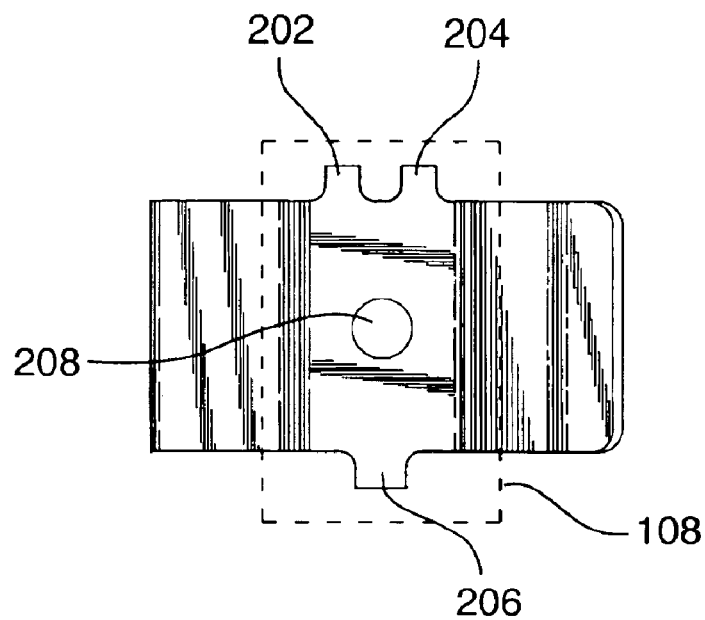
FIG. 3 is a close-up view of a mounting portion of the clip of FIGS. 1–2.

FIG. 3, which is a close-up view of a mounting portion of the clip of FIGS. 1–2, portrays the image of clip 104 as viewed by a vision system. Advantageously, legs 202, 204, 206 provide points of reference which enable the vision system to more easily determine the orientation of mounting portion 108, which in turn allows the orientation of clip 104 to be verified.

Figure 4:
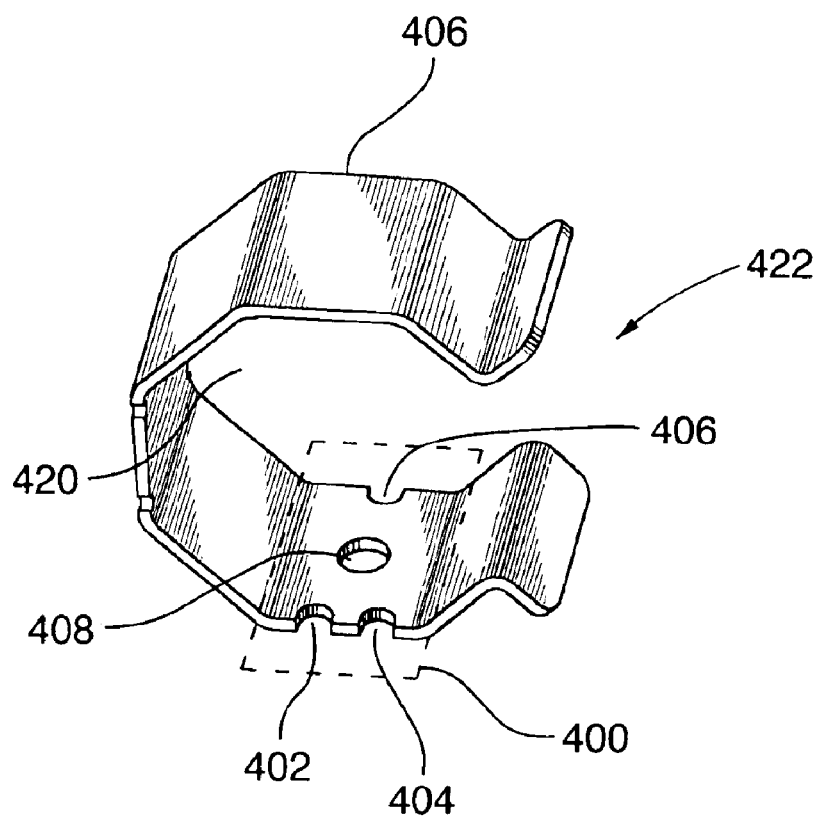
FIG. 4 is an illustration of a surface mountable clip having an alternative mounting portion.

FIG. 4 is an illustration of an alternative surface mountable clip 406. Similar to clip 104 of FIGS. 1–3, clip 406 is a metal structure having a plurality of planar sides which are integrally formed into a U-shape. The metal which forms clip 406 may be any suitable electrically conductive metal, such as phosphor bronze, beryllium copper (BeCu), or alloys thereof. The planar sides of clip 406 are integrally formed into a polygon shape having a single open side 422. In this embodiment, the planar sides of clip 406 are integrally formed into an "octagon" shape having a single open side 422 (i.e. octagon=8 sides with 1 open side=7 sides). However, any suitable number of planar sides may be utilized. In this embodiment, each planar side of clip 406 has dimensions of about 1.8 mm×2.5 mm×0.15 mm, and the octagon shape has a diameter of about 4.4 mm. Open side 422 of the generally U-shaped structure provides a flexibility and resiliency in clip 406 to facilitate the receiving and retaining of an electrical component (not shown in FIG. 4). As shown, open side 422 is flanged at both ends to further facilitate the receiving of the electrical component in a "snap-fit " type fashion. An opening 420 formed by the generally U-shape structure of clip 406 is sized to fit and retain the electrical component. One of the planar sides of clip 406, which may be referred to as a mounting portion 400 of clip 104, is used for supporting and mounting clip 406 over solder pad on the PCB (FIG. 1).

Clip 406 may be mounted to a PCB using SMT, as described above. Mounting portion 400 is mounted to the PCB such that mounting portion 400 is parallel to the surface of the PCB. Mounting portion 400 includes a hole 408 and notches 402, 404, 406. Hole 408 formed through the planar side is configured to break a surface tension of molten solder over a solder pad of the PCB during a reflow soldering process, so that the clip is stable and does not rotate during the process. Preferably, hole 408 is located in a center of mounting portion 400. Notches 402, 404, and 406 are formed along the sides and along the same plane as mounting portion 400. Notches 402 and 404 are formed along one side edge of mounting portion 400, whereas notch 406 is formed along the other side edge of mounting portion 400. The diameter of hole 408 may be between about 0.5 mm and 0.7 mm, and preferably 0.6 mm; whereas the dimensions of each notch 402, 404, and 406 may be about 0.3 mm×0.4 mm.

When clip 406 which includes mounting portion 400 is placed onto the solder pad 102, notches 402, 404, 406 and the opening 408 in mounting portion 400 provide multiple points of contact with the solder pad. As a result, the tension forces acting on clip 406 are balanced such that mounting portion 400 is stable, so that clip 406 does not shift or rotate into an undesirable position as it passes through the reflow oven. In fact, if the initial SMT placement position of clip 406 is slightly skewed or shifted, surface tension forces will help mounting portion 400 to be adjusted (moved or rotated) to the correct position. This is because the surface tension forces always intend to reach a balanced state. In addition, hole 408 in mounting portion 400 allows mounting portion 400 to sink into the solder of the solder pad as the clip assembly moves through the reflow oven. This prevents clip 406 from floating and changing position as the solder on the solder pad melts. Notches 402, 404, 406 and hole 408 in mounting portion 400 also provide increased surface area along the edges of mounting portion 400 which are in contact with the solder pad. As a result, mounting portion 400 is firmly attached to PCB 100 after it has passed through the reflow oven and cooled. Notches 402, 404, 406 provide points of reference which enable a vision system to more easily determine the orientation of mounting portion 400, which in turn allows the orientation of clip 406 to be verified.

Figure 5:
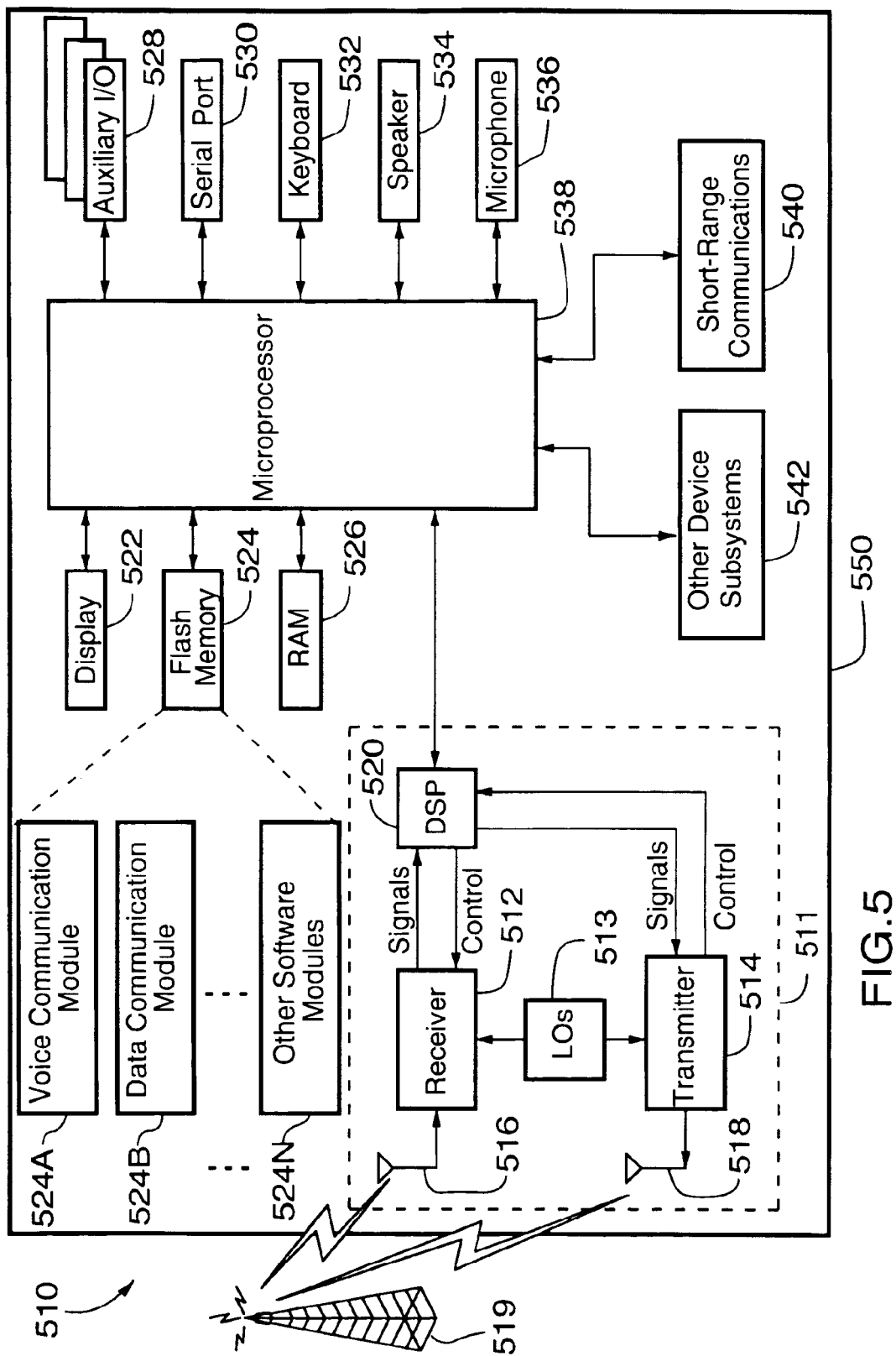
FIG. 5 is a schematic block diagram of a mobile communication device which utilizes the surface mountable clip of the present application for retaining an electrical component.

FIG. 5 is a block diagram of a mobile communication device 510 which may embody the present invention. The mobile communication device 510 includes components which are mounted to a PCB 550 using SMT. The mobile communication device 510 includes a radio frequency (RF) transceiver 511, a microprocessor 538, a display 522, Flash memory 524, RAM memory 526, auxiliary input/output (I/O) devices 528, a serial port 530, a keyboard 532, a speaker 534, a microphone 536, a short-range wireless communications sub-system 540, and may also include other device sub-systems 542. The transceiver 511 preferably includes transmit and receive antennas 516, 518, a receiver 512, a transmitter 514, one or more local oscillators 513, and a digital signal processor 520. The transmit and receive antennas 516, 518 are each attached to an antenna clip which is mounted to the PCB 550 as described in FIGS. 1–2.

Within the Flash memory 524, mobile communication device 510 preferably includes a plurality of software modules 524A–524N that can be executed by microprocessor 538 (and/or the DSP 520), including a voice communication module 524A, a data communication module 524B, and a plurality of other operational modules 524N for carrying out a plurality of other functions.

Mobile communication device 510 is preferably a two-way communication device having voice and data communication capabilities. Thus, for example, mobile communication device 510 may communicate over a voice network, such as any of the analog or digital cellular networks, and may also communicate over a data network. The voice and data networks are depicted in FIG. 5 by communication tower 519. These voice and data networks may be separate communication networks using separate infrastructure, such as base stations, network controllers, etc., or they may be integrated into a single wireless network.

Communication subsystem 511 is used to communicate with the voice and data network 519, and includes receiver 512, transmitter 514, one or more local oscillators 513 and may also include DSP 520. DSP 520 is used to send and receive signals to and from the transmitter 514 and receiver 512, and is also utilized to receive control information from transmitter 514 and to provide control information to receiver 512. If the voice and data communications occur at a single frequency, or closely-spaced set of frequencies, then a single local oscillator 513 may be used in conjunction with transmitter 514 and receiver 512. Alternatively, if different frequencies are utilized for voice communications versus data communications, then a plurality of local oscillators 513 can be used to generate a plurality of frequencies corresponding to the voice and data networks 519. Although two antennas 516, 518 are depicted in FIG. 5, mobile communication device 510 could be used with a single antenna structure. Information, which includes both voice and data information, is communicated to and from communication module 511 via a link between DSP 520 and microprocessor 538.

The detailed design of communication subsystem 511, such as frequency band, component selection, power level, etc., is dependent upon communication network 519 in which mobile communication device 510 is intended to operate. For example, a mobile communication device 510 intended to operate in a North American market may include a communication subsystem 511 designed to operate with the Mobitex™ or DataTAC™ mobile data communication networks and also designed to operated with any of a variety of voice communication networks, such as AMPS, TDMA, CDMA, PCS, etc., whereas a mobile communication device 510 intended for use in Europe may be configured to operate with the General Packet Radio Service (GPRS) data communication network and the GSM voice communication network. Other types of data and voice networks, both separate and integrated, may also be utilized with mobile communication device 510.

Depending upon the type of network or networks 519, the access requirements for mobile communication device 510 may also vary. For example, in the Mobitex and DataTAC data networks, mobile communication devices are registered on the network using a unique identification number associated with each device. In GPRS data networks, however, network access is associated with a subscriber or user of a mobile communication device. A GPRS device typically requires a subscriber identity module ("SIM"), which is required in order to operate a mobile communication device on a GPRS network. Local or non-network communication functions (if any) may be operable, without the SIM, but a mobile communication device will be unable to carry out any functions involving communications over data network 519, other than any legally required operations, such as 911 emergency calling.

After any required network registration or activation procedures have been completed, mobile communication device 510 may the send and receive communication signals, including both voice and data signals, over network 519 (or networks). Signals received by antenna 516 from communication network 519 are routed to receiver 512, which provides for signal amplification, frequency down conversion, filtering, channel selection, etc., and may also provide analog to digital conversion. Analog-to-Digital (A/D) conversion of the received signal allows more complex communication functions, such as digital demodulation and decoding to be performed using the DSP 520. In a similar manner, signals to be transmitted to network 519 are processed, including modulation and encoding, for example, by DSP 520 and are then provided to transmitter 514 for Digital-to-Analog (D/A) conversion, frequency up conversion, filtering, amplification and transmission to communication network 519 (or networks) via antenna 518. Although a single transceiver 511 is shown in FIG. 5 for both voice and data communications, it is possible that mobile communication device 510 may include two distinct transceivers, a first transceiver for transmitting and receiving voice signals, and a second transceiver for transmitting and receiving data signals.

In addition to processing the communication signals, DSP 520 also provides for receiver and transmitter control. For example, the gain levels applied to communication signals in receiver 512 and transmitter 514 may be adaptively controlled through automatic gain control algorithms implemented in DSP 520. Other transceiver control algorithms could also be implemented in DSP 520 in order to provide more sophisticated control of transceiver 511.

Microprocessor 538 preferably manages and controls the overall operation of mobile communication device 510. Many types of microprocessors or microcontrollers could be used here, or, alternatively, a single DSP 520 could be used to carry out the functions of microprocessor 538. Low-level communication functions, including at least data and voice communications, are performed through DSP 520 in transceiver 511. Other, high-level communication applications, such as a voice communication application 524A, and a data communication application 524B may be stored in Flash memory 524 for execution by microprocessor 538. For example, voice communication module 524A may provide a high-level user interface operable to transmit and receive voice calls between mobile communication device 510 and a plurality of other voice devices via network 519. Similarly, data communication module 524B may provide a high-level user interface operable for sending and receiving data, such as e-mail messages, files, organizer information, short text messages, etc., between mobile communication device 510 and a plurality of other data devices via the network 519.

Microprocessor 538 also interacts with other mobile communication device subsystems, such as display 522, Flash memory 524, random access memory (RAM) 526, auxiliary input/output (I/O) subsystems 528, serial port 530, keyboard 532, speaker 534, microphone 536, a short-range communications subsystem 540 and any other mobile communication device subsystems generally designated as 542.

Some of the subsystems shown in FIG. 5 perform communication-related functions, whereas other subsystems may provide resident or on-device functions. Notably, some subsystems, such as keyboard 532 and display 522 may be used for both communication-related functions, such as entering a text message for transmission over a data communication network, and device-resident functions such as a calculator or task list or other PDA type functions.

Operating system software used by microprocessor 538 is preferably stored in a persistent store such as Flash memory 524. In addition to the operating system, which controls all of the low-level functions of mobile communication device 510, Flash memory 524 may include a plurality of high-level software application programs, or modules, such as a voice communication module 524A, a data communication module 524B, an organizer module (not shown), or any other type of software module 524N. Flash memory 524 also may include a file system for storing data. These modules are executed by microprocessor 538 and provide a high-level interface with a user of the mobile communication device. This interface typically includes a graphical component provided through display 522, and an input/output component provided through auxiliary I/O 528, keyboard 532, speaker 534, and microphone 536. The operating system, specific mobile communication device software applications or modules, or parts thereof, may be temporarily loaded into a volatile store, such as RAM 526 for faster operation. Moreover, received communication signals may also be temporarily stored to RAM 526, before permanently writing them to a file system located in persistent store 524.

An exemplary application module 524N that may be loaded onto mobile communication device 510 is a personal information manager (PIM) application providing PDA functionality, such as calendar events, appointments, and task items. This module 524N may also interact with voice communication module 524A for managing phone calls, voice mails, etc., and may also interact with the data communication module for managing email communications and other data transmissions. Alternatively, all of the functionality of voice communication module 524A and data communication module 524B may be integrated into the PIM module.

Flash memory 524 preferably provides a file system to facilitate storage of PIM data items on the mobile communication device 510. The PIM application preferably includes the ability to send and receive data items, either by itself, or in conjunction with the voice and data communication modules 524A, 524B, via wireless network 519. The PIM data items are preferably seamlessly integrated, synchronized and updated, via the wireless network 519, with a corresponding set of data items stored or associated with a host computer system, thereby creating a mirrored system for data items associated with a particular user.

Mobile communication device 510 may also be manually synchronized with a host system by placing mobile communication device 510 in an interface cradle, which couples serial port 530 of mobile communication device 510 to the serial port of the host system. Serial port 530 may also be used to enable a user to set preferences through an external device or software application, or to download other application modules 524N for installation. This wired download path may be used to load an encryption key onto mobile communication device 510, which is a more secure method than exchanging encryption information via wireless network 519.

Additional application modules 524N may be loaded onto mobile communication device 510 through network 519, through an auxiliary I/O subsystem 528, through serial port 530, through short-range communications subsystem 540, or through any other suitable subsystem 542, and installed by a user in Flash memory 524 or RAM 526. Such flexibility in application installation increases the functionality of mobile communication device 510 and may provide enhanced on-device functions, communication-related functions, or both. For example, secure communication applications may enable electronic commerce functions and other such financial transactions to be performed using the mobile communication device 510.

When mobile communication device 510 is operating in a data communication mode, a received signal, such as a text message or a web page download, will be processed by the transceiver 511 and provided to microprocessor 538, which will preferably further process the received signal for output to display 522 or, alternatively, to an auxiliary I/O device 528. A user of mobile communication device 510 may also compose data items, such as email messages, using keyboard 532, which is preferably a complete alphanumeric keyboard laid out in the QWERTY style, although other styles of complete alphanumeric keyboards such as the known DVORAK style may also be used. User input to mobile communication device 510 is further enhanced with a plurality of auxiliary I/O devices 528, which may include a thumbwheel input device, a touchpad, a variety of switches, a rocker input switch, etc. The composed data items input by the user may then be transmitted over communication network 519 via transceiver 511.

When mobile communication device 510 is operating in a voice communication mode, the overall operation of mobile communication device 510 is substantially similar to the data mode, except that received signals are preferably be output to speaker 534 and voice signals for transmission are generated by a microphone 536. Alternative voice or audio I/O subsystems, such as a voice message recording subsystem, may also be implemented on mobile communication device 510. Although voice or audio signal output is preferably accomplished primarily through speaker 534, display 522 may also be used to provide an indication of the identity of a calling party, the duration of a voice call, or other voice call related information. For example, microprocessor 538, in conjunction with the voice communication module and the operating system software, may detect the caller identification information of an incoming voice call and display it on display 522.

A short-range communications subsystem 540 is also included in mobile communication device 510. For example, subsystem 540 may include an infrared device and associated circuits and components, or a short-range wireless communication module such as a Bluetooth™ module or an 802.11 module to provide for communication with similarly-enabled systems and devices. Those skilled in the art will appreciate that "Bluetooth" and 802.11 refer to sets of specifications, available from the Institute of Electrical and Electronics Engineers (IEEE), relating to wireless personal area networks and wireless LANs, respectively.

Figure 6:
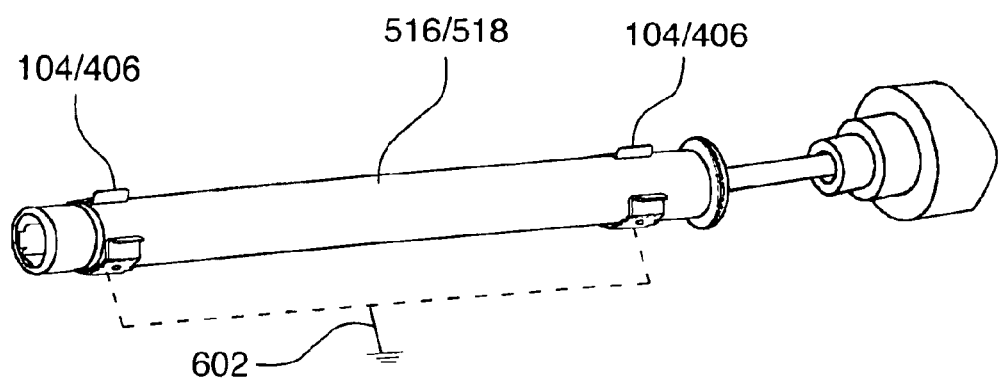
FIG. 6 is an illustration of two clips of the present application for retaining an electrical component which is an antenna of the mobile communication device of FIG. 5.

FIG. 6 is an illustration which shows how clips 104/406 of FIGS. 1–4 may be used to retain an electrical component in an electronic device. In the embodiment of FIG. 6, two clips 104/406 from FIGS. 1–4 are utilized to retain a single electrical component which is antenna 516/518 (e.g. see FIG. 5). The two clips 104/406 are mounted on two different solder pads of a PCB (not shown in FIG. 6) and are together used to retain antenna 516/518. Once properly assembled, antenna 516/518 is fixedly held by clips 104/406 onto the PCB. Note also that clips 104/406, being made of electrically conductive metal, facilitate a grounding 602 of antenna 516/518 on the PCB.

The above description relates to examples of the present invention only. Many variations will be apparent to those knowledgeable in the field, and such variations are within the scope of the application. For example, while the mounting portion as described mounts an antenna clip to a PCB, the mounting portion may alternatively be used to mount other components to a PCB, such as a tube clip, a battery connector, an antenna contact or coupler, any type of clip or fastener, or any other component which is mounted to a PCB using SMT.

Final Comments. A surface mountable clip suitable for use in a mobile communication device has been described. The mobile communication device includes a printed circuit board (PCB); a radio frequency (RF) transceiver carried on the PCB; and an antenna coupled to the RF transceiver. A surface mountable antenna clip is mounted on the PCB for retaining the antenna. The clip is made of a metal structure having a plurality of planar sides generally formed into a U-shape. An opening formed by the structure is sized to fit and retain the antenna. One of the planar sides of the metal structure is used to support the structure and is mounted over a solder pad on the PCB. A hole formed through this planar side is configured to break a surface tension of molten solder over the solder pad during a reflow soldering process, so that the clip is stable and does not rotate during the process. Legs extending from edges of this planar side also help to stabilize the clip during the process, and provide for an increased surface area for the connection. In fact, if the initial SMT placement position of the clip is slightly skewed or shifted, surface tension forces will help the clip to move or rotate into the correct position. The legs also provide sufficient features to a vision system to correctly orient the clip on the PCB.

The above-described embodiments of the present application are intended to be examples only. Those of skill in the art may effect alterations, modifications and variations to the particular embodiments without departing from the scope of the application. The invention described herein in the recited claims intend to cover and embrace all suitable changes in technology.

What is claimed is:

1. A mobile communication device comprising:

a printed circuit board (PCB);

a radio frequency (RF) transceiver carried on the PCB;

an antenna coupled to the RF transceiver;

at least one surface mountable antenna clip carried on the PCB which retains the antenna;

the at least one surface mountable antenna clip including:
 a metal structure having a plurality of planar sides generally formed into a U-shape;
 an opening formed by the generally U-shape metal structure being sized to receive and retain the antenna;
 a bottom planar side which is mounted over a solder pad on the PCB to support the generally U-shaped metal structure, such that the clip is free to rotate over a molten solder formed on the solder pad during a reflow soldering process; and
 a hole formed through the bottom planar side which is adapted to break a surface tension of the molten solder during the reflow soldering process.

2. The mobile communication device of claim 1, wherein the clip further comprises:

a first leg extending laterally from the first planar side.

3. The mobile communication device of claim 1, wherein the clip further comprises:

a first leg extending laterally from a first edge of the first planar side; and a second leg extending laterally from a second edge of the first planar side which is opposite the first edge.

4. The mobile communication device of claim 1, wherein the clip further comprises:

a first notch formed along a first edge of the bottom planar side.

5. The mobile communication device of claim 1, wherein the generally U-shaped metal structure is a single integrally formed structure.

6. The mobile communication device of claim 1, wherein the generally U-shaped metal structure comprises a polygon-shaped metal structure.

7. The mobile communication device of claim 1, wherein the surface mountable clip facilitates a grounding of the antenna on the PCB.

8. The mobile communication device of claim 1, wherein the bottom planar side is generally rectangle.

9. The mobile communication device of claim 1, wherein the at least one surface mountable antenna clip comprises a second surface mountable antenna clip for further retaining the antenna.

10. The mobile communication device of claim 1, further comprising:

a first leg extending laterally from the bottom planar side; and wherein the first leg is utilized by a vision system to position the clip onto the PCB.

* * * * *